(12) United States Patent
Nistler et al.

(10) Patent No.: US 6,226,781 B1
(45) Date of Patent: May 1, 2001

(54) MODIFYING A DESIGN LAYER OF AN INTEGRATED CIRCUIT USING OVERLYING AND UNDERLYING DESIGN LAYERS

(75) Inventors: John L. Nistler, Martindale; Frederick N. Hause; Phillip J. Etter, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/132,980

(22) Filed: Aug. 12, 1998

(51) Int. Cl.$^7$ .............................. G06F 17/10; G06F 7/60
(52) U.S. Cl. .................................. 716/19; 716/21
(58) Field of Search ................. 716/11, 17, 18, 716/19, 20, 21, 1, 2; 430/5, 1; 378/34

(56) References Cited

U.S. PATENT DOCUMENTS

| | | | |
|---|---|---|---|
| 3,751,647 | 8/1973 | Maeder et al. | 713/401 |
| 3,842,491 | 10/1974 | Depuy et al. | 438/14 |
| 5,553,273 | * 9/1996 | Liebmann | 716/21 |
| 5,553,274 | 9/1996 | Liebmann | 716/21 |
| 5,648,277 | * 7/1997 | Zhang et al. | 438/151 |
| 5,663,893 | * 9/1997 | Wampler et al. | 716/19 |
| 5,705,301 | 1/1998 | Garza et al. | 430/5 |
| 5,707,765 | 1/1998 | Chen | 430/5 |
| 5,723,233 | 3/1998 | Garza et al. | 430/5 |
| 5,773,315 | 6/1998 | Jarvis | 438/14 |
| 5,885,734 | * 3/1999 | Pierrat et al. | 716/19 |
| 6,057,171 | * 5/2000 | Chou et al. | 438/15 |

* cited by examiner

Primary Examiner—Matthew Smith
Assistant Examiner—Leigh Marie Garbowski
(74) Attorney, Agent, or Firm—Kevin L. Daffer; Conley, Rose & Tayon

(57) ABSTRACT

A computer-implemented method is provided in which a design layer of an integrated circuit is altered by spatial definition using underlying and overlying design layers. That is, the specific layers of an integrated circuit that impact the layer being modified are taken into account. According to an embodiment, the computer-implemented method is performed using, e.g., a CAD program. First, an original layout design comprising a plurality of design layers representing respective levels of an integrated circuit is generated. The targeted properties, e.g., electrical properties, of features in one design layer are determined based upon the arrangement of features in other design layers relative to the features in that one design layer. The features in the design layer being modified are then separated into different working layers such that each working layer includes features having at least one common targeted property. The features in each working layer may then be separately modified based upon the mutual targeted property of that working layer.

18 Claims, 5 Drawing Sheets

MODIFYING A DESIGN LAYER OF AN INTEGRATED CIRCUIT USING OVERLYING AND UNDERLYING DESIGN LAYERS

BACKGROUND OF THE INVENTION

1. Field of the Invention

This invention relates to integrated circuit fabrication and, more particularly, to a proximity correction in which the layout design of an integrated circuit layer is modified by spatial definition using the layout designs of underlying and overlying integrated circuit layers.

2. Description of the Related Art

Modern integrated circuits contain numerous structures or features, typically the size of a few microns. The features are placed in localized areas, and are either conductive, non-conductive or semi-conductive (i.e., rendered conductive in defined areas with dopants). A technique known as "lithography" is used to place such features. Lithography entails using radiation to pattern a photosensitive film. An optical image is transferred to the film from a patterned mask plate (i.e., reticle) placed in proximity to the film. The photosensitive film, i.e., "photoresist", has two main properties. First, solubility of the resist changes in response to it being exposed to appropriate radiation. Second, a hardened resist is resistant to attack by an etchant capable of removing selectively exposed conductive and/or insulative material.

According to a sequence of lithographic steps, the resist is first applied to a semiconductor topography. Next, a partially transparent mask plate is placed in close proximity to the resist. Patterns upon the mask plate are projected upon the topography using various forms of radiation. While ultraviolet light is the primary form of radiation being used, x-rays and electrons beams are growing in popularity. The radiation is transmitted through only the transparent portions of the mask plate to the resist film. The solubility of regions of the resist exposed to the radiation is altered by a photochemical reaction. The selectively exposed resist is then washed with a solvent that preferentially removes the resist areas of higher solubility. The now patterned resist is exposed to an etchant that removes those portions of the underlying topography unprotected (i.e., not covered) by the resist. Finally, the resist film is removed, leaving a duplicate of the mask plate pattern etched into a layer of the topography.

The layout design of each layer of an integrated circuit is typically generated using a computer-aided design program ("CAD"). The layout design may be replicated upon a quartz mask plate by etching the computer generated pattern into a metallic layer formed upon the mask plate. An exposure tool, e.g., a "stepper" apparatus, may be used to project the mask plate pattern onto the resist film during lithography. Most CAD programs follow a set of predetermined design rules set by processing and design limitations. For example, design rules define the minimum spacing between features of an integrated circuit layer to ensure the features are isolated from each other. Unfortunately, as integrated circuit speed and complexity continues to increase, the so-called "critical dimensions" of a circuit approach the resolution limit of the optical exposure tool. A critical dimension of an integrated circuit is the minimum feature size or the minimum spacing between features of the circuit. The resolution of an exposure tool describes its ability to distinguish closely spaced objects.

As the critical dimensions of the circuit layout approach the resolution limit of the exposure tool, the correspondence between the mask plate pattern and the pattern produced in the resist layer is significantly reduced. The degree of difference between the mask plate pattern and the resist pattern depends on the proximity of the circuit features to each other. Accordingly, the problems associated with transferring the mask plate pattern to the resist layer are referred to as "proximity effects". The occurrence of proximity effects may be largely due to the fact that the closer the features of the mask plate pattern, the more likely the radiation waves passing through the transparent regions of the mask plate are to interact. Moreover, pre-existing layers in a semiconductor topography may reflect the radiation waves. The interacting radiation waves may thus experience diffraction and reflection effects that cause the mask plate pattern to be incorrectly printed onto the resist layer. For example, sharp corners in the mask pattern may be printed as rounded corners in the resist layer. Further, the length of a feature printed in the resist layer may be shorter than the analogous feature in the mask plate pattern.

In addition to being distorted, the features patterned in the resist layer may also be misaligned relative to the features already patterned in the semiconductor topography. Unfortunately, absent proper alignment of successive layers of an integrated circuit to each other, the operability of the integrated circuit may be at risk. In the extreme, lithographic misalignment may lead to shorting between structures that should be isolated from each other and isolation of structures that should be coupled to each other. Even if the extreme scenario does not occur, the contact resistance between successive layers of conductors in an integrated circuit, if misaligned, may be significantly increased.

To compensate for the distortions occurring in the mask plate pattern as it is transferred to the resist layer, a technique known as optical proximity correction ("OPC") is commonly used. OPC involves biasing the layout design of an integrated circuit layer to make the pattern printed in the resist layer more like that of the original layout design. For example, a layout design may be altered to include square shaped features known as "serifs" protruding from the corner regions of the design. The presence of the serifs causes the pattern projected onto the resist layer to have sharp, rather than round corner regions. Conventional OPC techniques thus are used to achieve a desired optical appearance without being concerned with the electrical properties of the integrated circuit. However, it is not the optical appearance of the integrated circuit that allows the circuit to perform properly. Instead, it is the electrical characteristics of the integrated circuit features that determine performance. Therefore, an integrated circuit may appear to be formed according to plan even though it might function improperly.

Globally or selectively sizing features of a design layer is a common OPC technique. The features are typically enlarged to ensure that elements in different levels of an integrated circuit overlap each other by a sufficient amount, despite being misaligned. However, OPC does not take into account the design of other integrated circuit levels. The OPC only considers the proximity of features within a unitary design layer relative to each other. See, for example, FIGS. 1–3. FIG. 1 illustrates a layout design of an integrated circuit. The layout design includes features 10 and 14 which represent active areas in one level of an integrated circuit. Features 12 and 16 which represent gate conductors are positioned in the design layer above respective features 10 and 14. Further, features 18 which represent local interconnects extend above and between active features 10 and 14. Also, features 20 which represent contacts 20 are positioned above features 12, 16, and 18. As shown in FIG. 2, features 20 are enlarged by the same amount in all directions, regardless of the positions of the features arranged in design layers beneath features 20.

FIG. 3 illustrates a top plan view of an integrated circuit formed according to the layout design depicted in FIG. 1 and the correction to the layout design depicted in FIG. 2. Contacts 20 are mis-aligned relative to gate conductors 12 and 16 and local interconnects 18. The contacts 20 residing above local interconnects 18 may come in contact with active area 10 as a result of being mis-aligned. As such, mis-aligned contacts 20 may undesirably short together active area 10 and local interconnect 18. Therefore, globally increasing the sizes of contact 20 without taking into account the positions of underlying structures can be detrimental to the operation of an integrated circuit.

It would therefore be of benefit to develop a technique in which a design layer is modified by considering the design layers of underlying and overlying levels of an integrated circuit. That is, the configuration of other design layers besides the one being altered should be used to determine the modifications to be made to that one design layer. As such, it may be necessary to alter the features within a single design layer differently. Further, the corrections to the design layer must take into account the electrical properties of features of the integrated circuit in addition to the optical appearance of those features. Otherwise, the appearance of the integrated circuit may lead one to falsely believe that the circuit operates according to design.

SUMMARY OF THE INVENTION

The problems outlined above are in large part solved by the proximity correction technique hereof in which a design layer of an integrated circuit is altered by spatial definition using underlying and overlying design layers. That is, the specific layers of an integrated circuit that impact the layer being modified are taken into account. According to an embodiment, the proximity correction is performed using, e.g., a CAD program. First, an original layout design comprising a plurality of design layers representing respective levels of an integrated circuit is generated. The targeted properties, e.g., electrical properties, of features in one design layer are determined based upon the arrangement of features in other design layers relative to the features in that one design layer. The features in the design layer being modified are then separated into different working layers such that each working layer includes features having at least one common targeted property.

Placing features having the same properties from a design layer into a working layer allows those features to be altered while ignoring other features of the design layer. In this manner, the complexity involved in modifying the various features of a design layer is lessened. A different algorithm is applied to each working layer to vary the dimensions of the features in the various working layers by different amounts. In particular, a continuous function is identified for each working layer that permits the features in that working layer to be sized while the features in other working layers are defined to be zero or non-existent. Applying a different algorithm to each working layer accounts for the fact that features arranged above or below different types of structures in an integrated circuit have dissimilar targeted properties. For example, the electrical properties of a local interconnect arranged above a gate conductor are different from the electrical properties of a local interconnect arranged above a field oxide. Relying on the electrical properties rather than the optical appearance of an integrated circuit to correct a design layer helps ensure that the optimum operating conditions of the circuit are achieved. After all the working layers have been corrected and subjected to a design rule checker, they may be recombined into a corrected layout design which is transferred to a lithography masking plate.

The proximity correction technique therefore contemplates breaking a global design issue into sub-parts or sub-layers and addressing each sub-layer independently. This approach is more practical than conventional approaches that attempt to solve a random design problem globally such as the so-called "artificial intelligence" approaches or neural network approaches.

In one embodiment, the features of a working layer may be divided into sub-working layers. Each sub-working layer includes features that share more targeted properties than the features in the primary working layer. For example, a local interconnect design layer may be corrected using working layers and sub-working layers. The features in the design layer having a minimum area are placed into a first working layer, and the remaining features are placed into a second working layer. Separating the features of minimum dimensions from other features takes into account the fact that small features optically print and etch in a different manner than larger features. The features in the first working layer that represent local interconnects overlapping active areas are placed into a first sub-working layer while the remaining features are placed into a second sub-working layer. A different sizing algorithm is applied to each sub-working layer of the first working layer. The features in the second working layer that represent local interconnects overlapping active areas are then placed in a different sub-working layer from the features that represent local interconnects overlapping polysilicon structures. A different sizing algorithm may also be applied to the two sub-working layers of the second working layer. Various factors affect the sizing algorithm chosen for each sub-working layer. The integrated circuit level represented by a sub-working layer may, for example, have different lithography critical dimensions, etch critical dimensions, and electrical critical dimensions than other integrated circuit levels.

BRIEF DESCRIPTION OF THE DRAWINGS

Other objects and advantages of the invention will become apparent upon reading the following detailed description and upon reference to the accompanying drawings in which.

Figure 1:
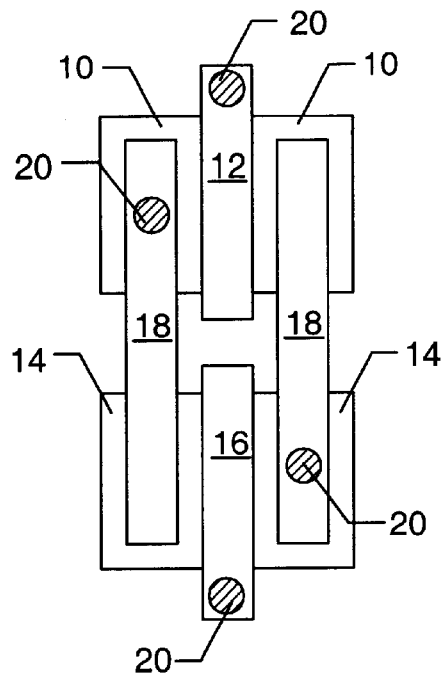
FIG. 1 depicts a layout design of an integrated circuit, wherein the layout design comprises design layers which represent different levels of the integrated circuit.
Figure 2:
FIG. 2 depicts the features of a contact design layer of the layout design being enlarged using optical proximity correction.
Figure 3:
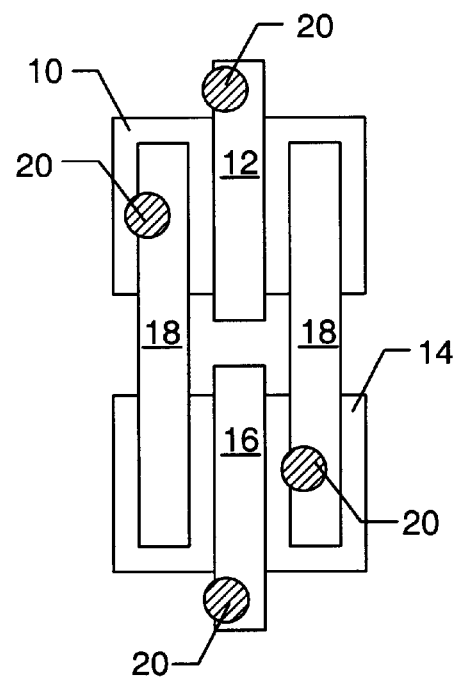
FIG. 3 depicts an integrated circuit which has been fabricated using the layout design shown in FIG. 1 and the optical proximity correction shown in FIG. 2, wherein the enlarged contacts are mis-aligned from their targeted positions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
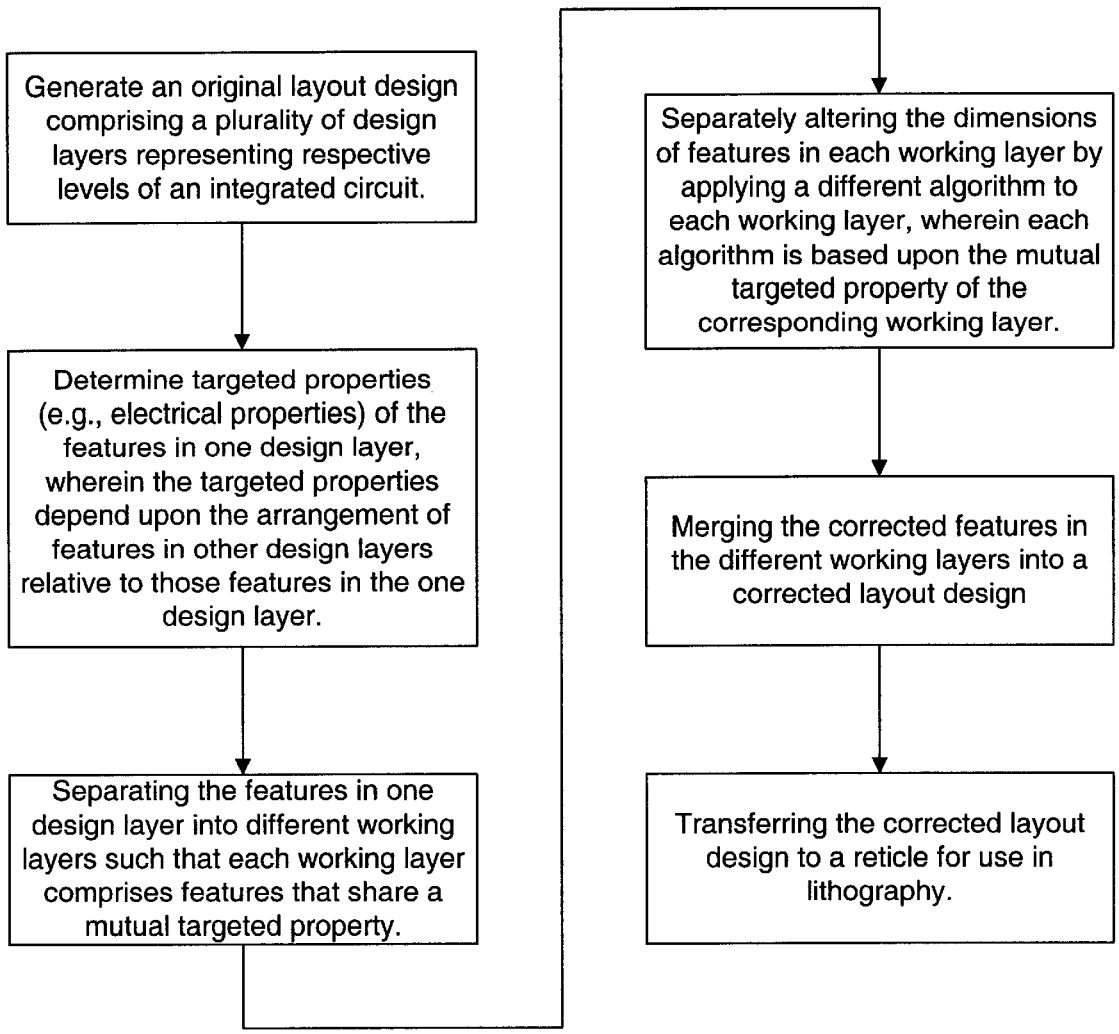
FIG. 4 depicts a general flow diagram of a proximity correction technique.

FIG. 4 illustrates a flow diagram of a computer-implemented method for performing a proximity correction on an integrated circuit layout design. An original layout design comprising a plurality of design layers representing respective levels of an integrated circuit is generated using a CAD program. Targeted properties of the features in one design layer are then determined based upon the arrangement of features in other design layers relative to the features in the one design layer. For example, the targeted electrical properties of a local interconnect extending across a field region is substantially dissimilar from the targeted electrical properties of a local interconnect extending across an active region. The features in the design layer are then separated into different working layers such that each working layer comprises features having at least one mutual targeted property. The dimensions of the features in each working layer may then be separately altered by applying a different algorithm to each working layer. The algorithm for each working layer may be partially influenced by the mutual targeted property of the corresponding working layer. Once the features in the different working layers have been corrected, they may be merged into a unitary corrected layout design. The corrected layout design may be transferred to a mask plate (i.e., reticle) for use in lithography using well-known techniques. The steps depicted in FIG. 4 may be applied to various types of design layers, e.g., a local interconnect design layer, a polysilicon design layer, a contact design layer, and a conductor design layer.

Figure 5:
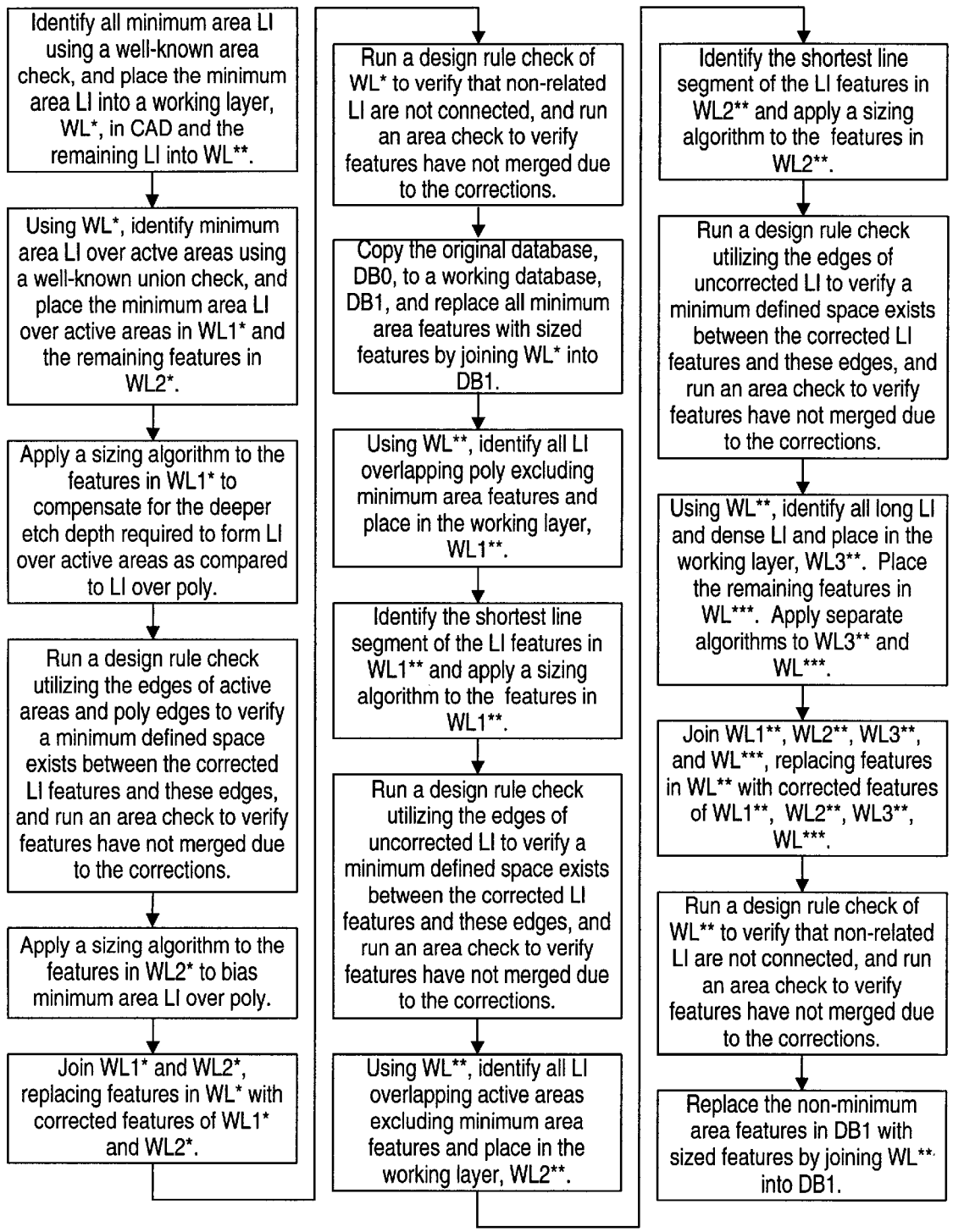
FIG. 5 depicts a detailed flow diagram of a proximity correction technique which may be used to modify a local interconnect design layer.

FIG. 5 depicts an exemplary flow diagram of a computer-implemented method for performing a proximity correction on a local interconnect design layer. The computer-implemented method may be performed using CAD. First, a well-known area check is applied to the original layout design to identify the features representing the local interconnects ("LI") which are smallest in size, i.e., the minimum area LI. Those minimum area LI are then placed in one working layer WL*, and the remaining LI area placed into another working layer WL**. Using WL*, the minimum area LI that overlap active areas are identified using a well-known union check and placed in sub-working layer WL1*. The remaining minimum area LI are placed in WL2*. A sizing algorithm is then applied to the features in WL1* to compensate for the deeper etch depth required to form LI over active areas as compared to LI over polysilicon structures. The following functions are used to determine the new dimensions of the LI features in WL1*:

$$X1'=Midpoint(\overline{X1X2})-\tfrac{1}{2}(\overline{X1X2})-\tfrac{1}{2}*C1$$

$$X2'=Midpoint(\overline{X1X2})+\tfrac{1}{2}(\overline{X1X2})+\tfrac{1}{2}*C1$$

$$Y1'=Midpoint(\overline{Y1Y2})-\tfrac{1}{2}(\overline{Y1Y2})-\tfrac{1}{2}*C2$$

$$Y2'=Midpoint(\overline{Y1Y2})+\tfrac{1}{2}(\overline{Y1Y2})+\tfrac{1}{2}*C2$$

where X1X2 represents the length of the LI feature and Y1Y2 represents the width of the LI features. X2'−X1' thus indicates the corrected length of the LI feature while Y2'−Y1' indicates the corrected width. The length and width of the LI feature is preferably calculated in Cartesian space, but may alternatively be calculated in other spaces such as elliptical space. Constants C1 and C2 are corrections that need to be made to the design layer to obtain a targeted electrical signal for the LI feature being sized.

Subsequently, a design rule check using the edges of the active area features and the polysilicon features may be applied to WL1* to verify that a minimum defined space exists between the corrected LI features and those edges. The LI features that fail the design rule check may be adjusted manually, not at all, or by applying the sizing algorithm again using slightly different C1 and C2 values. No adjustments are made if only a few LI features fail the design rule check. The dimensions of the features in WL1* are manually adjusted in CAD if there are a reasonable number of LI features that fail. On the other hand, if several LI features fail the design rule check, the computerimplemented algorithm is once again applied to WL1*. An area check may also be run to verify that the LI features have not merged due to the corrections. The corrections C1 and C2 in the above functions are replaced with respective corrections C3 and C4. The functions are then applied to the LI features in WL2*. In this manner, the minimum area LI over polysilicon structures are biased. Thereafter, the corrected LI features in WL1* and WL2* are joined, and the features in WL* are replaced with the corrected features in WL1* and WL2*. The area check is repeated to verify that the features in WL* have not merged due to the corrections. Also, a design rule check is run to verify that non-related LI have not become connected. The original database DB0 containing the original layout design of the integrated circuit is then copied to a working database DB1. The minimum area LI features in DB1 are replaced with sized features by joining WL* into DB1.

Figure 6:
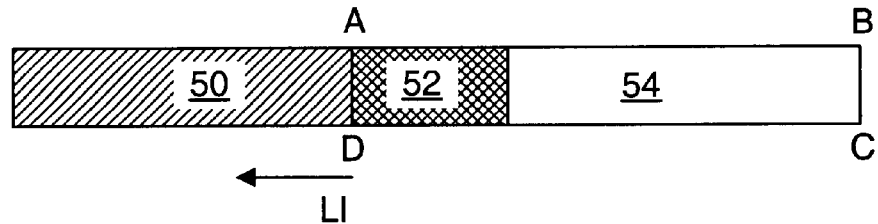
FIGS. 6–10 depict specific examples of local interconnect features in a first design layer being modified based on the arrangement of polysilicon features in a second design layer underlying the first design layer.
Figure 7:
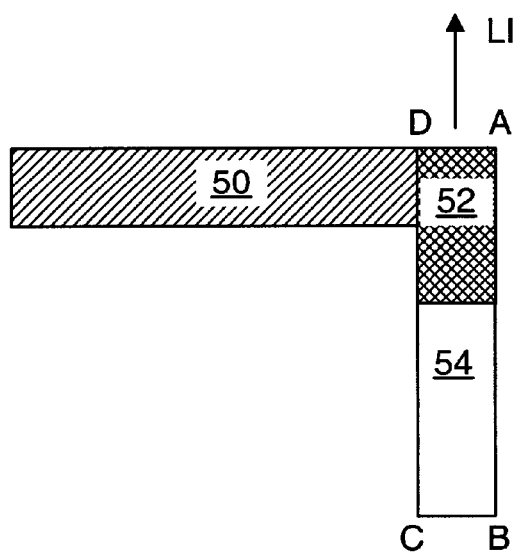

A union check is applied to WL to identify all the LI overlapping polysilicon structures excluding the minimum area LI. Those identified features are placed in a working layer WL. The LI features in WL1* having the shortest length is then identified so that a sizing algorithm may be applied to those features. As an example, the LI features in WL1** are broken up into line segments AB, DC, AD, and BC, as shown in FIG. 6. Line segments AB and DC are longer than AD, and line segment BC does not overlap any polysilicon structures. Thus, the points A and D of the polygon are moved so that AB'>AB and DC'>DC. FIGS. 6, 7, 8, 9, and 10 depict specific examples of LI features 54 being modified relative to the arrangement of underlying polysilicon features 50. Region 52 in each figure represents the area of overlap between the underlying polysilicon feature 50 and the overlying LI feature 54. The arrow in each figure indicates the direction in which the LI feature 54 is extended. The following equations are used to modify the dimensions of the LI features shown in FIGS. 6, 7, 8, and 9:

If AD<AB or CD, and AD shares the same space as an underlying polysilicon structure, then $A'(x,y)=A(x-C1,y)$, where the slope of AB=0 and B(x,y)−A(x, y)>0.0

$A'(x,y)=A(x+C1,y)$, where the slope of AB=0 and B(x,y)−A(x, y)<0.0

$D'(x,y)=A(x-C1,y)$, where the slope of AB=0 and B(x,y)−A(x, y)>0.0

$D'(x,y)=A(x+C1,y)$, where the slope of AB=0 and B(x,y)−A(x, y)<0.0

Figure 8:
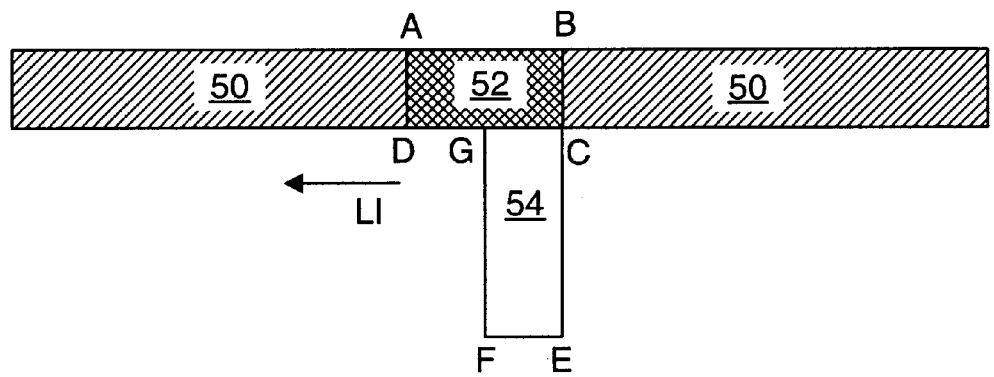
Figure 9:
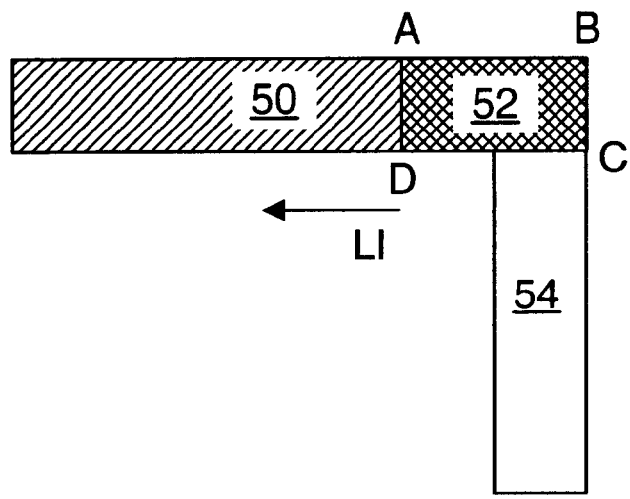
Figure 10:
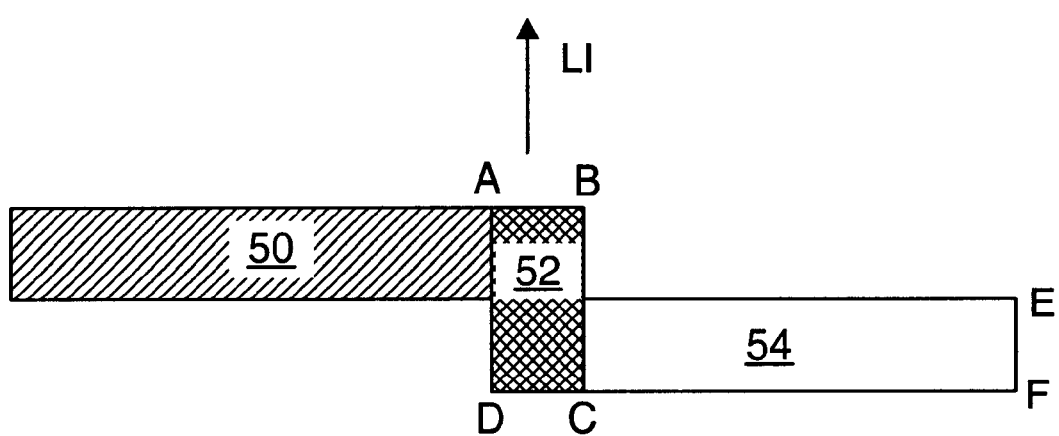

It should be noted that in FIG. 8, segment BC is not modified because segment BE is the actual line segment seen in CAD. The polygon is defined by the points A, B, E, F, G, and D. Since C is not a node of the polygon, no line segment is associated with line segment BC. For special cases, for example, in the case where two smallest line segments are identified, the previous equations are still valid, assuming that AD<AB or CD and BC<AB or CD. In this case, similar equations can be written for line segment BC. A design rule check is applied to WL1 to verify that a minimum defined space exists between the corrected LI features and the uncorrected LI features. Also, an area check may be used to verify that features in WL1 have not merged as a result of being sized.

The LI overlapping active areas excluding minimum area features are identified by applying a union check to WL. Those LI overlapping active areas are then placed in working layer WL2. The LI features in WL2 may then be subjected to the same algorithm, design rule check, and area check as the features in WL1, except that different constants may be utilized to account for different process or electrical desired characteristics. Long LI features (e.g., length >2×the minimum feature size) and dense features (i.e., features spaced apart by a minimum spacing distance) of WL may then be placed in working layer WL3 while the remaining features are placed in WL*. A different sizing algorithm may be applied to WL3 and WL*, depending upon the desired process or electrical characteristics of the features in these working layers. The features in WL are replaced with the corrected features in WL1, WL2, WL3, and WL*. A final design rule check may be applied to WL to verify that non-related LI have not become connected, and an area check may be run to verify that the LI features have not merged due to the corrections. The sized features in WL are then substituted for corresponding features in DB1 to complete the correction process.

It will be appreciated to those skilled in the art having the benefit of this disclosure that this invention is believed to provide a computer-implemented method for modifying the layout design of an integrated circuit layer by spatial definition using the layout designs of underlying and overlying integrated circuit layers. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A computer-implemented method for performing a proximity correction on an integrated circuit layout design, comprising:
    generating an original layout design comprising a plurality of design layers representing respective levels of an integrated circuit;
    determining targeted properties of first features in one design layer, wherein the targeted properties depend upon an arrangement of second features in other design layers relative to the first features;
    separating the first features of the first design layer into different working layers, wherein each working layer comprises the first features that share a mutual targeted property; and
    separately altering the first features in said each working layer based upon the mutual targeted property of that working layer.

2. The method of claim 1, wherein the targeted properties comprise electrical properties.

3. The method of claim 1, wherein said separately altering the first features comprises applying a different algorithm to said each working layer.

4. The method of claim 1, wherein said separately altering the first features comprises using a different set of functions to vary dimensions of the first features in said each working layer.

5. The method of claim 1, further comprising verifying that the features within said each working layer meet pre-defined parameters using a design rule checker.

6. The method of claim 1, further comprising merging the working layers into a corrected layout design subsequent to said separately altering the first features.

7. The method of claim 1, further comprising transferring the corrected layout design to a reticle for use in lithography.

8. The method of claim 1, wherein the first features represent local interconnects, and wherein the second features represent active areas and polysilicon structures.

9. The method of claim 8, wherein said separating the first features of the first design layer into different working layers comprises placing a first portion of the first features into a first working layer, wherein the first portion represents the local interconnects that comprise a minimum area and overlap the active areas.

10. The method of claim 9, wherein said separating the first features of the first design layer into different working layers further comprises placing a second portion of the first features into a second working layer, wherein the second portion represents the local interconnects that comprise the minimum area and overlap the polysilicon structures.

11. The method of claim 10, wherein said separating the first features of the first design layer into different working layers further comprises placing a third portion of the first features into a third working layer, wherein the third portion represents the local interconnects that comprise areas greater than the minimum area and overlap the polysilicon structures.

12. The method of claim 11, wherein said separating the first features of the first design layer into different working layers further comprises placing a fourth portion of the first features into a fourth working layer, wherein the fourth portion represents the local interconnects that comprise the areas greater than the minimum area and overlap the active areas.

13. A computer-implemented method for performing a proximity correction on an integrated circuit layout design, comprising:
    generating an original layout design comprising a plurality of design layers representing respective levels of an integrated circuit;
    determining a targeted electrical property of a first feature in one design layer, wherein the targeted electrical property depends upon a position of the first feature relative to a second feature in another design layer;
    attributing the first feature to a working layer comprising other features having the same targeted electrical property as the first feature; and
    altering the first feature and the other features in the working layer based upon the targeted electrical property.

14. The method of claim 13, wherein said altering the first features and the other features comprises applying an algorithm to the working layer.

15. The method of claim 13, wherein said altering the first features and the other features comprises varying dimensions of the first feature and the other feature.

16. The method of claim 13, further comprising verifying that the first feature and the other features meet pre-defined parameters using a design rule checker.

17. The method of claim 13, further comprising placing the working layer into a corrected layout design subsequent to said altering the first feature and the other features.

18. The method of claim 13, further comprising transferring the corrected layout design to a reticle for use in lithography.

* * * * *